(12) United States Patent
Lu

(10) Patent No.: US 8,547,173 B2
(45) Date of Patent: Oct. 1, 2013

(54) SIGNAL AMPLIFYING CIRCUIT AND SIGNAL AMPLIFYING METHOD

(75) Inventor: Wu-Hung Lu, Xindian (TW)

(73) Assignee: VIA Telecom, Inc., San Diego, CA (US)

(*) Notice: Subject to any disclaimer, the term of this patent is extended or adjusted under 35 U.S.C. 154(b) by 517 days.

(21) Appl. No.: 12/837,754

(22) Filed: Jul. 16, 2010

(65) Prior Publication Data

US 2011/0261976 A1    Oct. 27, 2011

(30) Foreign Application Priority Data

Apr. 23, 2010  (CN) ............... 2010 1 0167168

(51) Int. Cl.
*H03G 3/20* (2006.01)

(52) U.S. Cl.
USPC .......................... 330/136; 330/129

(58) Field of Classification Search
USPC ............. 330/136, 129, 301, 285, 296
See application file for complete search history.

(56) References Cited

U.S. PATENT DOCUMENTS

| | | | | |
|---|---|---|---|---|
| 4,383,188 A * | 5/1983 | Crosby | .......... | 341/136 |
| 5,430,410 A * | 7/1995 | Raynaud et al. | ............ | 330/279 |
| 6,324,229 B1 | 11/2001 | Browder | | |
| 6,891,438 B2 * | 5/2005 | Arai et al. | ............ | 330/296 |
| 7,397,304 B2 * | 7/2008 | Wang | ............ | 330/136 |
| 7,733,175 B2 * | 6/2010 | Lu et al. | ............ | 330/136 |
| 7,994,855 B2 * | 8/2011 | Garg | ............ | 330/136 |
| 8,183,932 B2 * | 5/2012 | Zolfaghari | ............ | 330/301 |

FOREIGN PATENT DOCUMENTS

KR    10-2008-0064535    7/2008

OTHER PUBLICATIONS

English language translation of abstract of KR 10-2008-0064535 (published Jul. 9, 2008).

* cited by examiner

*Primary Examiner* — Henry Choe
(74) *Attorney, Agent, or Firm* — McClure, Qualey & Rodack, LLP

(57) ABSTRACT

A signal amplifying circuit is provided. The signal amplifying circuit includes a signal amplifier and a control circuit. The control circuit includes a compare unit and a register unit. The compare unit compares an input signal of the signal amplifier with a reference signal to generate a compare signal. The register unit receives and registers a control signal to be transmitted to the signal amplifier, and provides a registered signal to the signal amplifier according to the registered control signal when the compare signal is changed.

12 Claims, 7 Drawing Sheets

SIGNAL AMPLIFYING CIRCUIT AND SIGNAL AMPLIFYING METHOD

CROSS REFERENCE TO RELATED APPLICATIONS

This Application claims priority of China Patent Application No. 201010167168.3, filed on Apr. 23, 2010, the entirety of which is incorporated by reference herein.

BACKGROUND OF THE INVENTION

1. Field of the Invention

The invention relates to a signal amplifying circuit, and more particularly to an audio signal amplifying circuit which is used to prevent POP noises from occurring in an audio amplifier.

2. Description of the Related Art

Audio amplifiers are widely used in multimedia electronic products, which amplify an audio input signal and generate an output current or voltage according to the amplified audio signal to drive a speaker for generating sound. In general, a loading of the speaker is small. Thus, larger output voltages or current provided by an audio amplifier is needed to drive the speaker.

When an audio power amplifier is powered on or off, an uncomfortable pop noise may be induced if the switching is not smooth enough during the period when an audio signal suddenly appears or disappears. For example, if the audio amplifier is enabled or disabled at the moment that the voltage of the audio input signal is at a maximum value or a minimum value, a large output signal is generated instantaneously, and then an annoying pop noise is generated through the speaker.

Therefore, control circuits and control methods thereof are desired to avoid generation of POP noises for an audio amplifier.

BRIEF SUMMARY OF THE INVENTION

A signal amplifying circuit and a signal amplifying method for a signal amplifier are provided. An embodiment of a signal amplifying circuit includes a signal amplifier and a control circuit. The control circuit includes a compare unit and a register unit. The compare unit compares an input signal of the signal amplifier with a reference signal to generate a compare signal. The register unit receives and registers a control signal to be transmitted to the signal amplifier, and provides a registered signal to the signal amplifier according to the registered control signal when the compare signal is changed.

Furthermore, an embodiment of a signal amplifying method for a signal amplifier is provided. The signal amplifying method includes: receiving and registering a control signal to be transmitted to the signal amplifier; comparing an input signal of the signal amplifier with a reference signal to generate a compare signal; and providing a registered signal to the signal amplifier according to the registered control signal when the compare signal is changed.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
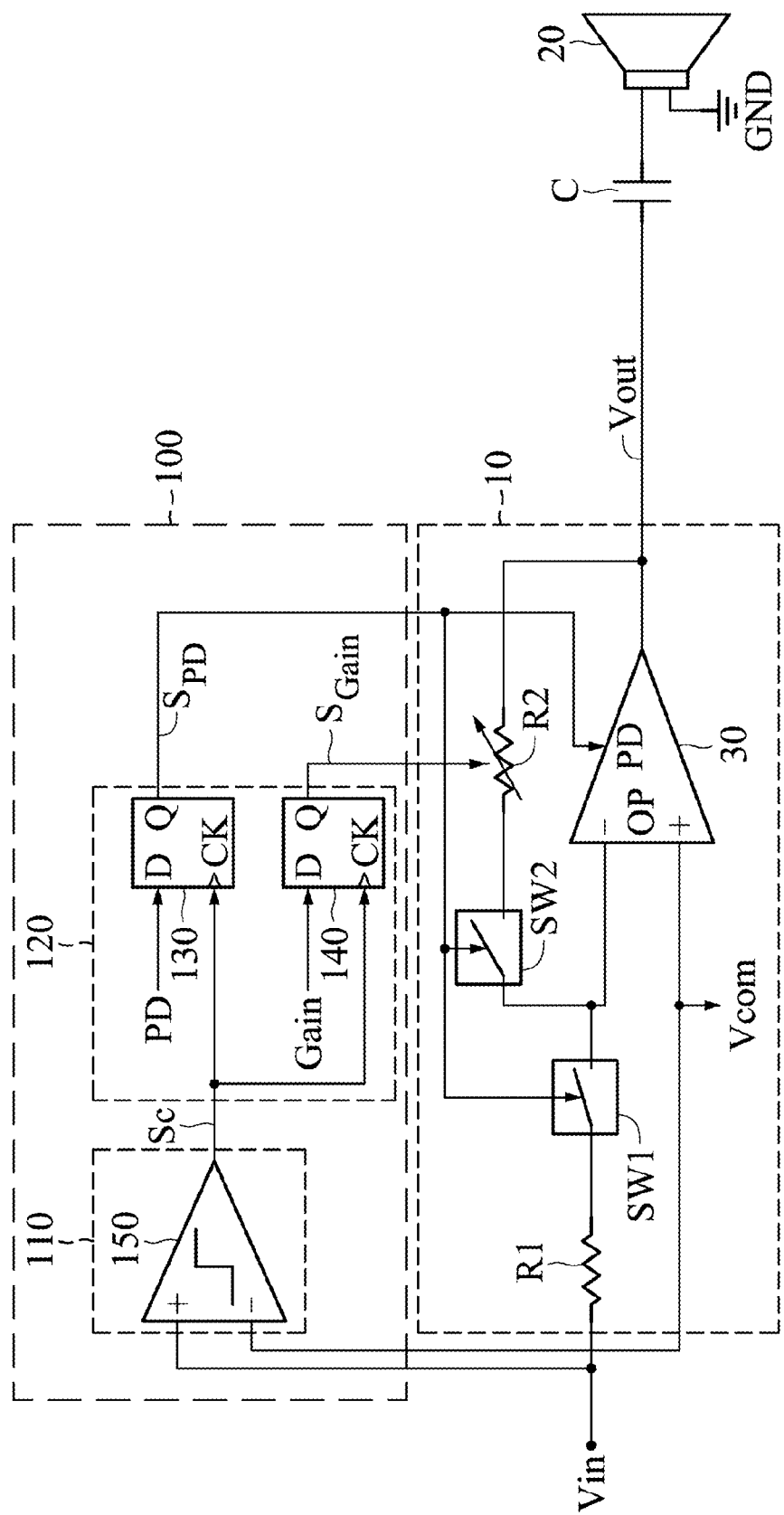
FIG. 1 shows a signal amplifying circuit according to an embodiment of the invention.

FIG. 1 shows a signal amplifying circuit including an audio amplifier 10 and a control circuit 100 according to an embodiment of the invention. In FIG. 1, the audio amplifier 10 is a single-ended audio amplifier, which amplifies an audio input signal Vin according to a ratio of a variable resistor R2 to a resistor R1 and generates an audio output signal Vout to a capacitor C to drive a speaker 20. The audio amplifier 10 includes an operational amplifier (OP) 30, two switches SW1 and SW2, the resistor R1 and the variable resistor R2. The switch SW1 is coupled between the resistor R1 and an inverting input terminal of the OP 30, and the switch SW2 is coupled between the variable resistor R2 and the inverting input terminal of the OP 30. In addition, a non-inverting input terminal of the OP 30 is coupled to a common signal Vcom which is a common-mode ground voltage or an alternating current (AC) ground voltage of the OP 30. The control circuit 100 includes a compare unit 110 and a register unit 120. The compare unit 110 uses a comparator 150 to compare the audio input signal Vin with the common signal Vcom and generate a compare signal Sc. In the embodiment, while a non-inverting input terminal of the comparator 150 is used to receive the audio input signal Vin and an inverting input terminal of the comparator 150 is used to receive the common signal Vcom, it is to be understood that the invention is not limited thereto. The register unit 120 includes two flip-flops 130 and 140 (e.g. D type flip-flop, T type flip-flop or other equivalent circuits). In the embodiment, types of the flip-flops 130 and 140 and connective relationships between the signals are used as examples, and do not limit the invention. The clock terminals of the flip-flops 130 and 140 are coupled to the compare unit 110 to receive the compare signal Sc. Furthermore, an input terminal of the flip-flop 130 is used to receive a control signal PD, and an input terminal of the flip-flop 140 is used to receive a control signal Gain.

Figure 2:
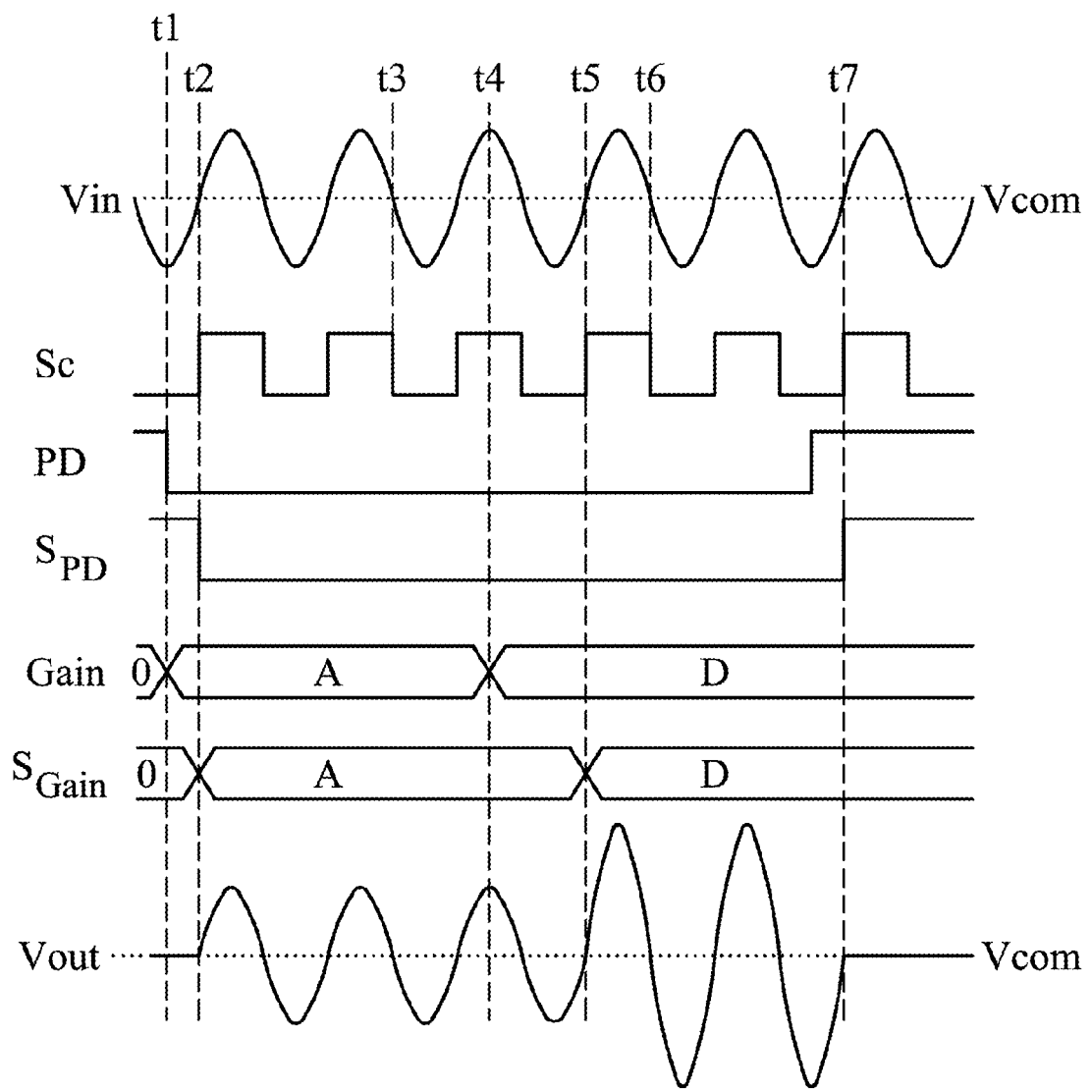
FIG. 2 shows a waveform diagram illustrating the signals of the signal amplifying circuit in FIG. 1.

FIG. 2 shows a waveform diagram illustrating the signals of the signal amplifying circuit in FIG. 1. Referring to FIG. 1 and FIG. 2 together, the compare signal Sc outputs a logic level "1" when the audio input signal Vin is larger than the common signal Vcom. On the contrary, the compare signal Sc outputs a logic level "0" when the audio input signal Vin is smaller than the common signal Vcom. Therefore, if the audio input signal Vin gradually increases and exceeds the common signal Vcom, the compare signal Sc will become a logic level "1" from a logic level "0", as shown in the time points t2, t5 and t7 of FIG. 2. If the audio input signal Vin gradually decreases below the common signal Vcom, the compare signal Sc will become a logic level "0" from a logic level "1", as shown in the time points t3 and t6 of FIG. 2. In the time point t2, the compare signal Sc is changed to a logic level "1" from a logic level "0". Thus, the flip-flop 130 provides a registered signal $S_{SPD}$ with a logic level "0" to the audio amplifier 10 according to the control signal PD, so as to enable the OP 30 and turn on the switches SW1 and SW2. In the meantime, the flip-flop 140 provides a registered signal $S_{Gain}$ with a value "A" to the audio amplifier 10 according to the control signal Gain, so as to adjust a resistance of the variable resistor R2. Next, the audio amplifier 10 amplifies the audio input signal Vin according to the ratio of the variable resistor R2 to the resistor R1 and generates the audio output signal Vout to drive the speaker 20. Although the control signals PD and Gain are input at the moment that the voltage of the audio input signal Vin has a minimum value (as shown in the time point t1), the control circuit 100 may enable the audio amplifier 10 at the moment that the voltage of the audio input signal Vin is close to the voltage of the common signal Vcom; thus, avoiding POP noises. Similarly, when the control signal PD wants to turn off the audio amplifier 10, the control circuit 100 may also disable the audio amplifier 10 at the moment that the voltage of the audio input signal Vin is close to the voltage of the common signal Vcom, as shown in the time point t7. Moreover, in the time point t5, the flip-flop 140 may provide the registered signal $S_{Gain}$ with a value "D" to the audio amplifier 10 according to the control signal Gain, so as to increase the resistance of the variable resistor R2. Next, the audio amplifier 10 provides the audio output signal Vout to drive the speaker 20 according to the ratio of the variable resistor R2 to the resistor R1. Though the control signal Gain is changed at the moment that the voltage of the audio input signal Vin has a maximum value (as shown in the time point t4), the control circuit 100 still adjusts the gain of the audio amplifier 10 at the moment that the voltage of the audio input signal Vin is close to the voltage of the common signal Vcom; thus, preventing POP noises from occurring. Furthermore, in an embodiment, the compare unit 110 further includes other relative circuits to generate a pulse signal to the clock terminals of the flip-flops 130 and 140 when the compare signal Sc is changed from a logic level "0" to a logic level "1" or from a logic level "1" to a logic level "0", so as to control and adjust the audio amplifier 10 more quickly.

Figure 3:
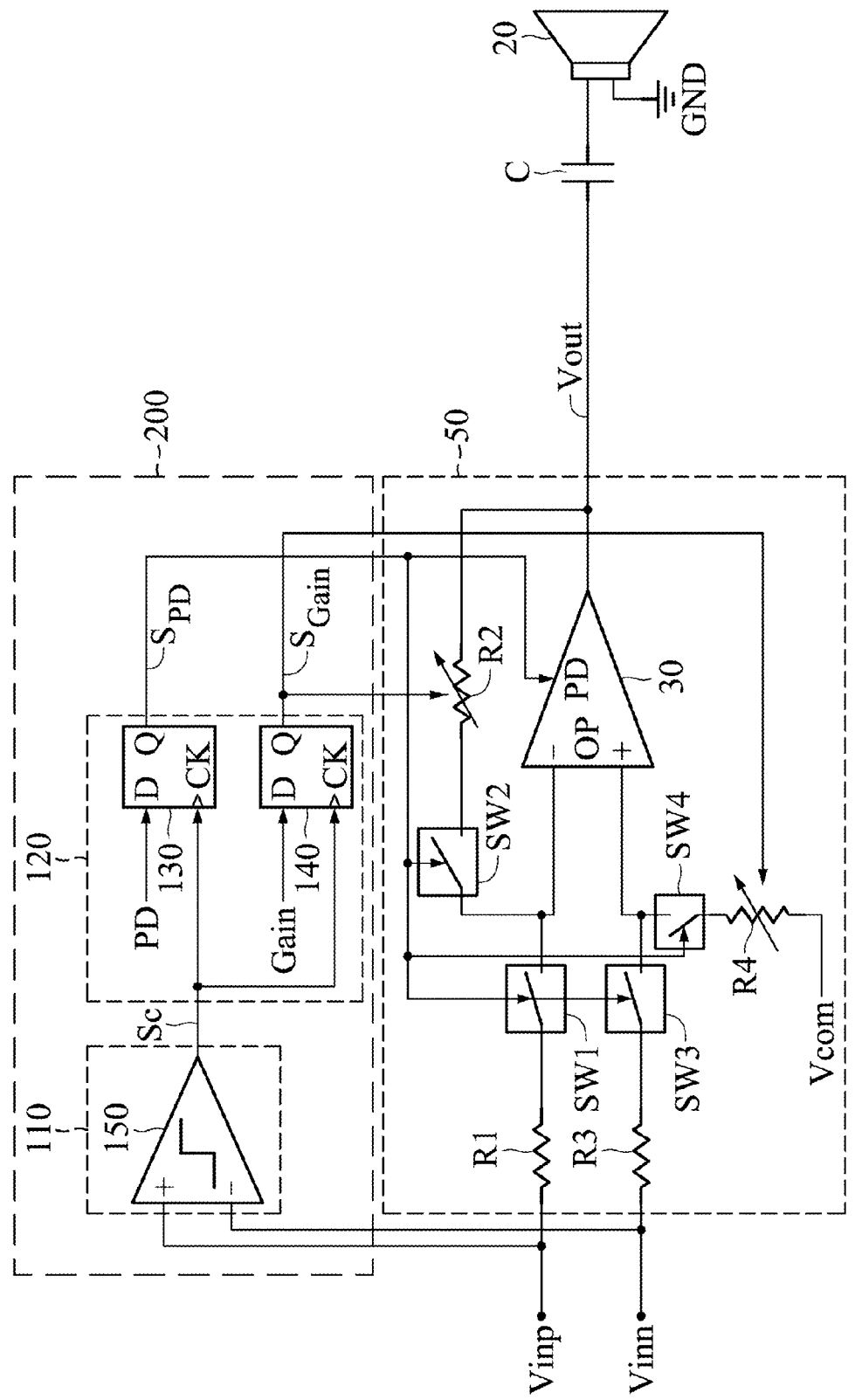
FIG. 3 shows a signal amplifying circuit according to another embodiment of the invention.
Figure 4:
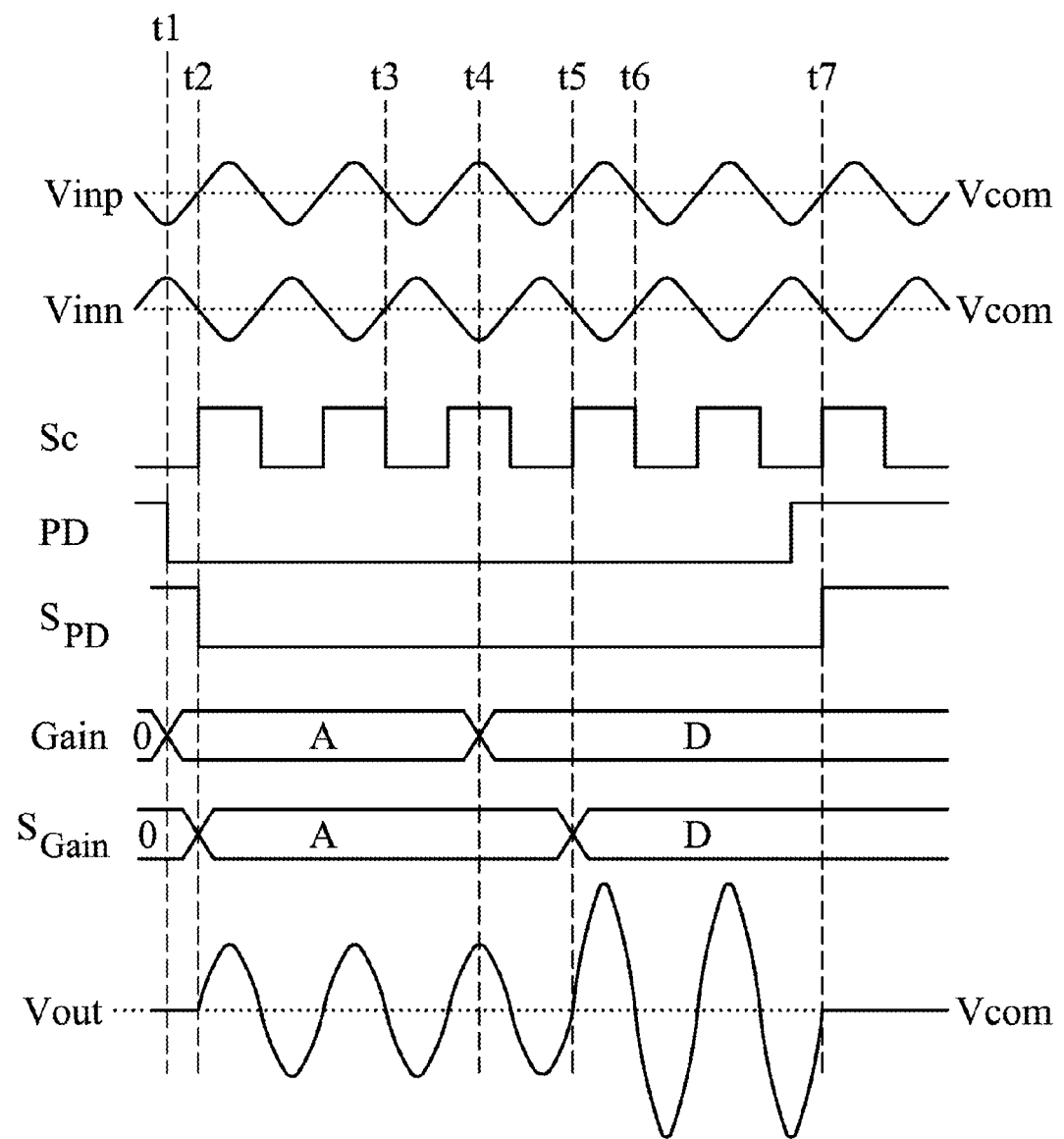
FIG. 4 shows a waveform diagram illustrating the signals of the signal amplifying circuit in FIG. 3.

FIG. 3 shows a signal amplifying circuit including an audio amplifier 50 and a control circuit 200 according to another embodiment of the invention. Compared to the audio amplifier 10 of FIG. 1, the audio amplifier 50 is a differential audio amplifier, wherein the audio input signals Vinp and Vinn are the differential pair input signals of the OP 30. In addition, the audio amplifier 50 further includes two switches SW3 and SW4, a resistor R3 and a variable resistor R4, wherein the switch SW3 is coupled between the resistor R3 and the non-inverting input terminal of the OP 30, and the switch SW4 is coupled between the variable resistor R4 and the non-inverting input terminal of the OP 30. In general, the resistors R1 and R3 have the same resistance, and the variable resistors R2 and R4 have the same resistance. It is to be noted that, compared to the comparator 150 of the control circuit 100, the comparator 150 of the control circuit 200 compares the audio input signal Vinp with the audio input signal Vinn to generate the compare signal Sc. Referring to FIG. 4, FIG. 4 shows a waveform diagram illustrating the signals of the signal amplifying circuit of FIG. 3. By comparing the audio input signals Vinp and Vinn, the control circuit 200 may enable/disable the audio amplifier 50 or adjust a gain of the audio amplifier 50 at the moment that the voltage of the audio input signals Vinp and Vinn are close to the common signal Vcom (i.e. the audio input signals Vinp and Vinn cross mutually); thus, preventing POP noises from occurring.

For a comparator, it is possible that a few noises will influence its compare result. For example, offset exists in a comparator due to device mismatch caused by fabrication processes; thus, influencing output result for the comparator. Therefore, a comparator may obtain no output result when an audio input signal is too small or the comparator has a large offset.

Figure 5:
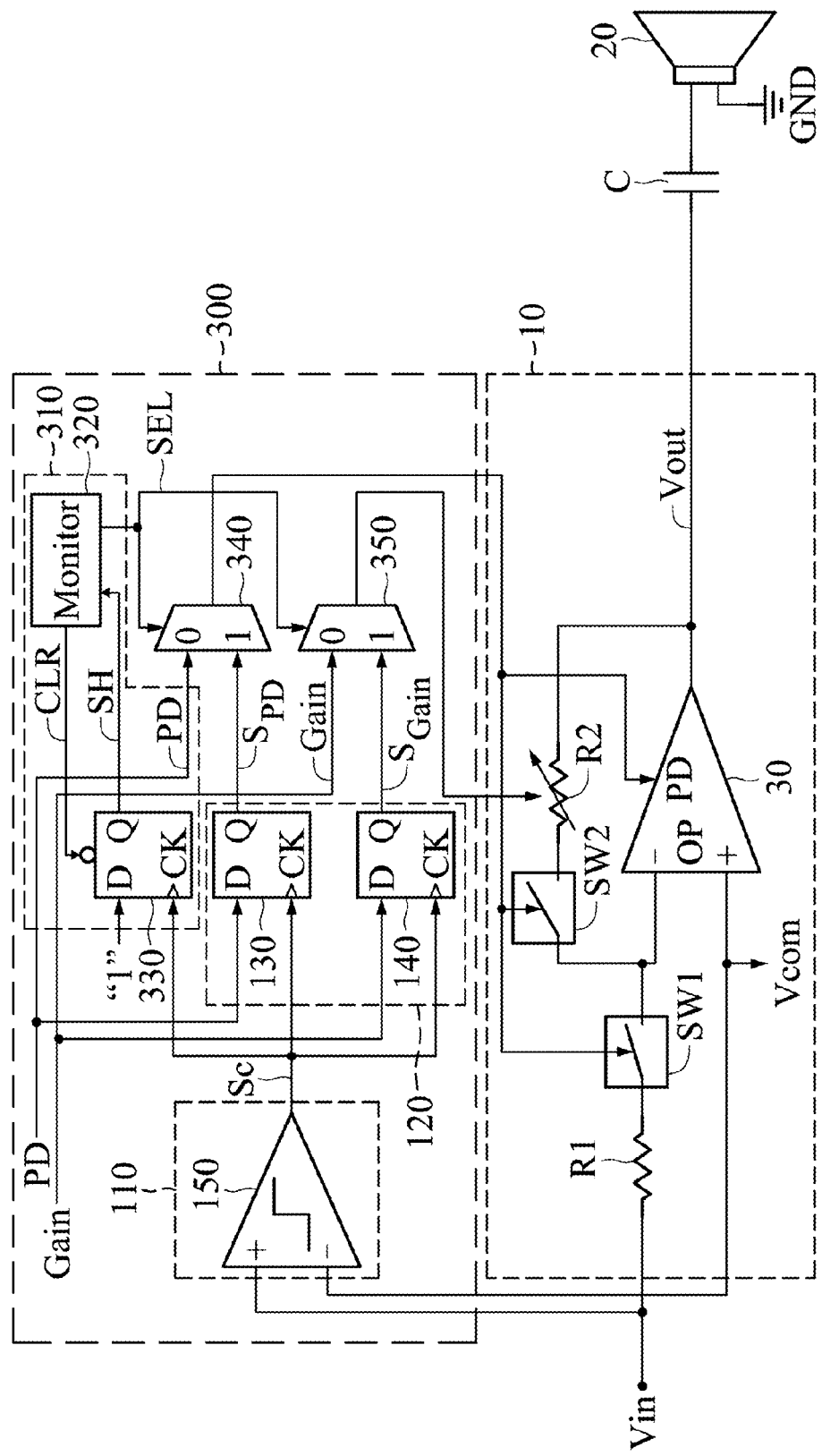
FIG. 5 shows a signal amplifying circuit according to another embodiment of the invention.

FIG. 5 shows a signal amplifying circuit including the audio amplifier 10 and a control circuit 300 according to another embodiment of the invention. Compared to the control circuit 100 of FIG. 1, the control circuit 300 further includes a control module 310 and two multiplexers 340 and 350, wherein the control module 310 includes a monitor 320 and a flip-flop 330 (e.g. D type flip-flop, T type flip-flop or other equivalent circuits). A clock terminal of the flip-flop 330 is coupled to the compare unit 110 to receive the compare signal Sc, and an input terminal of the flip-flop 330 is used to receive a signal with a logic level "1". Therefore, the flip-flop 330 may provide a signal SH with a logic level "1" to the monitor 320 when the compare signal Sc is changed form a logic level "0" to a logic level "1". In the embodiment, type of the flip-flop 330 and connective relationships between the signals are used as examples, and do not limit the invention. Next, the monitor 320 increases its counting value by "1" when receiving the signal SH with a logic level "1", and then generates a clear signal CLR to the flip-flop 330, to reset the flip-flop 330. Therefore, the monitor 320 may count the total amount of changing times that the compare signal Sc is changed from a logic level "0" to a logic level "1" during a specific time period, wherein the specific time period is determined according to the frequency range of the audio input signal. When the total amount of changing times of the compare signal Sc counted during the specific time period is larger than a specific value, the monitor 320 provides a select signal SEL with a logic level "1" to the multiplexers 340 and 350. Thus, the multiplexer 340 provides the registered signal $S_{PD}$ from the flip-flop 130 to the audio amplifier 10 according to the select signal SEL, so as to control the OP 30 and the switches SW1 and SW2. Simultaneously, the multiplexer 350 provides the registered signal $S_{Gain}$ from the flip-flop 140 to the audio amplifier 10 according to the select signal SEL, so as to adjust the resistance of the variable resistor R2. On the contrary, if the total amount of changing times of the compare signal Sc counted by the monitor 320 during the specific time period is smaller than or equal to the specific value due to the audio input signal Vin being too small or the comparator 150 having a large offset, the monitor 320 would provide the select signal SEL with a logic level "0" to the multiplexers 340 and 350. Next, the multiplexer 340 provides the control signal PD to the audio amplifier 10 according to the select signal SEL such that the control signal PD may directly control the OP 30 and the switches SW1 and SW2. In the meantime, the multiplexer 350 provides the control signal Gain to the audio amplifier 10 according to the select signal SEL such that control signal Gain may directly adjust the resistance of the variable resistor R2. In other words, if the output result of the comparator 150 is interfered, the control module 310 may bypass the register unit 120 and directly provides the control signals PD and Gain to the audio amplifier 10.

Figure 6:
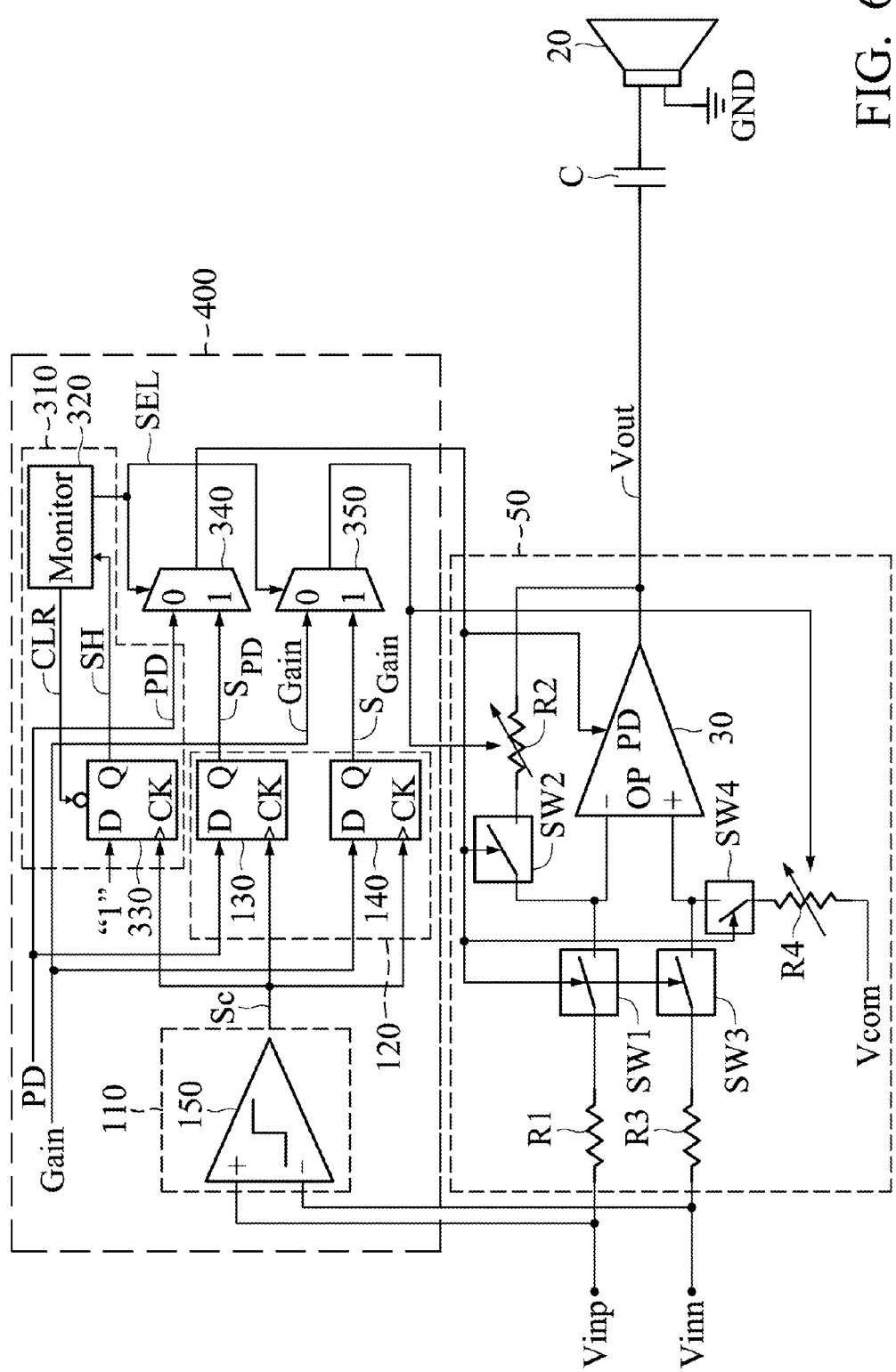
FIG. 6 shows a signal amplifying circuit according to another embodiment of the invention.

Similarly, a control circuit with a control module may be applied to a differential audio amplifier, as shown in a control circuit 400 and the audio amplifier 50 of FIG. 6. Furthermore, other control signals (e.g. a driving current control signal) of an audio amplifier may also adjust the internal setting of the audio amplifier through the control circuits disclosed in the invention and then to reduce the occurrence of POP noise. Moreover, the control circuits disclosed in the invention may also be applied to any stage audio amplifiers in an audio signal process procedure of an electronic product, such as an input stage, an amplifying stage, an output stage and so on.

Figure 7:
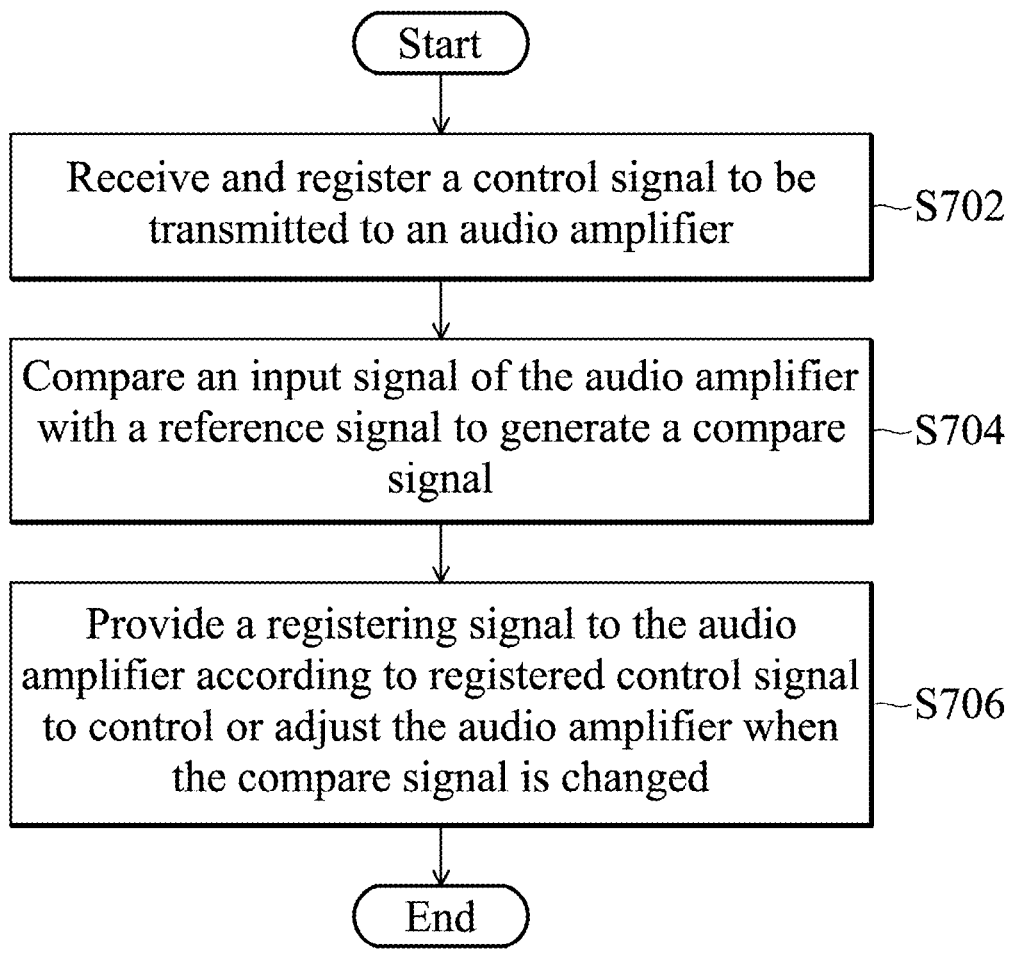
FIG. 7 shows a signal amplifying method according to an embodiment of the invention, wherein the signal amplifying method is used to prevent POP noises from occurring in an audio amplifier.

FIG. 7 shows a signal amplifying method according to an embodiment of the invention, wherein the signal amplifying method is used to prevent POP noises from occurring in an audio amplifier. First, a control signal to be transmitted to the audio amplifier is received and registered (step S702). Next, an input signal of the audio amplifier is compared with a reference signal to generate a compare signal (step S704). When the audio amplifier includes a single-ended operational amplifier, the reference signal is a common mode ground signal of the single-ended operational amplifier. When the audio amplifier includes a differential operational amplifier, the reference signal and the input signal are the differential pair input signals of the differential operational amplifier. Next, in step S706, a registered signal is provided to the audio amplifier according to the registered control signal to control or adjust the audio amplifier when the compare signal is changed, such as from a logic level "1" to a logic level "0" or from a logic level "0" to a logic level "1". Therefore, the audio amplifier is enabled/disabled or the gain or driving current of the audio amplifier is adjusted at the moment that the input signal is very close to the reference signal; thus, preventing POP noises from occurring. In addition, as described above, a control module (e.g. 310 of FIG. 5) may be used to count the total amount of changing times of the compare signal during a specific time period, so as to selectively provide the control signal or the registered signal to the audio amplifier according to the counted total amount of changing times of the compare signal.

The control circuit and control method disclosed in the invention are not limited to control an audio amplifier. The control circuits of the invention may also be used to enable/disable other signal amplifiers or adjust the gain or driving current of the other signal amplifiers; thus, avoiding large transient currents generated at the moment that an input signal of the signal amplifier has a maximum value or a minimum value.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal amplifying circuit, comprising:
    a signal amplifier; and
    a control circuit, comprising:
        a compare unit, comparing an input signal of the signal amplifier with a reference signal to generate a compare signal; and
        a register unit, receiving and registering a control signal to be transmitted to the signal amplifier, and providing the registered control signal to the signal amplifier when the compare signal is changed,
    wherein the register unit comprises:
        a first flip-flop, having a first input terminal for receiving the control signal, a first clock terminal for receiving the compare signal, and a first output terminal for providing the registered control signal to the signal amplifier,
        wherein the first flip-flop provides the registered control signal to the signal amplifier when the compare signal is charged from a first logic level to a second logic level.

2. The signal amplifying circuit as claimed in claim 1, wherein the signal amplifier comprises one of the following:
    a single-ended operational amplifier, wherein the reference signal is a common mode ground signal of the single-ended operational amplifier when the signal amplifier comprises the single-ended operational amplifier; and
    a differential operational amplifier, wherein the reference signal and the input signal are the differential pair input signals of the differential operational amplifier when the signal amplifier comprises the differential operational amplifier.

3. The signal amplifying circuit as claimed in claim 1, further comprises:
    a control module, counting the total amount of changing times for the compare signal to change from a first logic level to a second logic level during a specific time period, and generating a select signal according to the counted total amount of changing times; and
    a multiplexer coupled to the register unit and the signal amplifier, selectively providing the control signal or the registered control signal to the signal amplifier according to the select signal.

4. The signal amplifying circuit as claimed in claim 3, wherein the multiplexer provides the control signal to the signal amplifier when the select signal indicates that the counted total amount of changing times of the compare signal is smaller than or equal to a specific value; and the multiplexer provides the registered control signal to the signal amplifier when the select signal indicates that the counted total amount of changing times of the compare signal is larger than the specific value.

5. The signal amplifying circuit as claimed in claim 3, wherein the control module comprises:
    a monitor; and
    a second flip-flop, having a second input terminal for receiving a signal with logic level '1', a second clock terminal for receiving the compare signal, and a second output terminal for providing the signal with logic level '1' to the monitor when the compare signal is changed from the first logic level to the second logic level,
    wherein the monitor increases the counted total amount of changing times of the compare signal and resets the second flip-flop when receiving the signal with logic level '1'.

6. The signal amplifying circuit as claimed in claim 1, wherein the control signal is used to control one of the following: enabling the signal amplified, disabling the signal amplifier, adjusting a driving current of the signal amplifier, and adjusting a gain of the signal amplifier.

7. A signal amplifying method for a signal amplifier, comprising:
    receiving and registering a control signal to be transmitted to the signal amplifier;
    comparing an input signal of the signal amplifier with a reference signal to generate a compare signal;
    providing the registered control signal to the signal amplifier when the compare signal is changed;
    counting the total amount of changing times for the compare signal to change from a first logic level to a second logic level during a specific time period, and generating a select signal according to the counted total amount of changing times; and selectively providing the control signal or the registered control signal to the signal amplifier according to the select signal.

8. The signal amplifying method as claimed in claim 7, wherein the signal amplifier comprises one of the following:

a single-ended operational amplifier, wherein the reference signal is a common mode ground signal of the single-ended operational amplifier when the signal amplifier comprises the single-ended operational amplifier; and a differential operational amplifier, wherein the reference signal and the input signal are the differential pair input signals of the differential operational amplifier when the signal amplifier comprises the differential operational amplifier.

9. The signal amplifying method as claimed in claim 7, wherein the step of providing the registered control signal to the signal amplifier further comprises:

providing the registered control signal to the signal amplifier when the compare signal is charged from a first logic level to a second logic level.

10. The signal amplifying method as claimed in claim 7, wherein the step of selectively providing the control signal or the registered control signal to the signal amplifier further comprises:

providing the control signal to the signal amplifier when the select signal indicates that the counted total amount of changing times of the compare signal is smaller than or equal to a specific value; and providing the registered control signal to the signal amplifier when the select signal indicates that the counted total amount of changing times of the compare signal is larger than the specific value.

11. The signal amplifying method as claimed in claim 7, wherein the step of counting the counted total amount of changing times for the compare signal to change from the first logic level to the second logic level further comprises:

providing a signal with logic level '1' to a monitor when the compare signal is changed from the first logic level to the second logic level; and increasing the the counted total amount of times of the compare signal when the monitor receives the signal with logic level '1'.

12. The signal amplifying method as claimed in claim 7, further comprising one of the following:

enabling the signal amplifier according to the registered control signal;

disabling the signal amplifier according to the registered control signal;

adjusting a driving current of the signal amplifier according to the registered control signal; and adjusting a gain of the signal amplifier according to the registered control signal.

* * * * *